US007009246B2

(12) United States Patent
Kawata et al.

(10) Patent No.: US 7,009,246 B2
(45) Date of Patent: Mar. 7, 2006

(54) SEMICONDUCTOR DEVICE

(75) Inventors: Takahiro Kawata, Ome (JP); Shigeru Nakahara, Musashimurayama (JP); Keiichi Higeta, Hamura (JP)

(73) Assignee: Hitachi, Ltd., Tokyo (JP)

( * ) Notice: Subject to any disclaimer, the term of this patent is extended or adjusted under 35 U.S.C. 154(b) by 56 days.

(21) Appl. No.: 10/772,391

(22) Filed: Feb. 6, 2004

(65) Prior Publication Data

US 2004/0159882 A1 Aug. 19, 2004

(30) Foreign Application Priority Data

Feb. 19, 2003 (JP) ............................ 2003-040542

(51) Int. Cl.
*H01L 29/72* (2006.01)

(52) U.S. Cl. ...................... 257/327; 257/202; 257/204; 257/206; 257/368; 257/371

(58) Field of Classification Search ................ 257/327, 257/202, 204, 206, 368, 371
See application file for complete search history.

(56) References Cited

U.S. PATENT DOCUMENTS

2001/0043085 A1 11/2001 Shimazaki et al.
2002/0063267 A1 * 5/2002 Kumagai et al. ........... 257/202

FOREIGN PATENT DOCUMENTS

| | | |
|---|---|---|
| JP | 5-120882 | 5/1993 |
| JP | 5-267617 | 10/1993 |
| JP | 11-7776 | 1/1999 |
| JP | 2001-332695 | 11/2001 |

* cited by examiner

*Primary Examiner*—Edward Wojciechowicz
(74) *Attorney, Agent, or Firm*—Mattingly, Stanger, Malur & Brundidge, P.C.

(57) ABSTRACT

To reduce the width of isolation between the first and second p channel MIS•FETs driven by different voltages, a first p channel MIS•FET driven by a first supply voltage and a second p channel MIS•FET driven by a second supply voltage higher than the first supply voltage are arranged in the same n well of the same semiconductor substrate, and the second supply voltage is supplied as a common well bias voltage to the n well.

15 Claims, 14 Drawing Sheets

SEMICONDUCTOR DEVICE

BACKGROUND OF THE INVENTION

The present invention relates to a technique for a semiconductor device, and more particularly to a technique effectively applied to a semiconductor device having elements driven by different supply voltages on the same semiconductor substrate.

For example, Japanese Patent Laid-Open No. 5-120882 discloses the technique in which the voltage level of one or both of a memory cell power-supply line and a word line is boosted to achieve a low-voltage operation of an SRAM (Static Random Access Memory). In this SRAM, MOS•FETs (Metal Oxide Semiconductor Field Effect Transistors) driven by different supply voltages are mixed on the same semiconductor substrate, and different well bias voltages are supplied to each of the MOSFETs driven by different supply voltages.

Also, for example, Japanese Patent Laid-Open No. 11-7776 discloses the method of supplying level-up voltage to a memory cell, in which the voltage (VDD) before the boosting is supplied as n well bias voltage of a p channel MOS•FET.

Additionally, for example, Japanese Patent Laid-Open No. 5-267617 discloses the structure in which the memory cell of a DRAM (Dynamic Random Access Memory) is provided in an exclusive well for memory cell and the memory cell is electrically isolated from a well for peripheral circuit.

SUMMARY OF THE INVENTION

However, in the technique in which the different well bias voltages are supplied to each of the MOS•FETs with different supply voltages, it is necessary to arrange relatively wide isolations between the MOS•FETs with the different supply voltages for the purpose of preventing a latch-up phenomenon from occurring between the MOS•FETs with the different supply voltages and, therefore, the problem of a increase in the chip size occurs. Additionally, when the voltage (VDD) before the boosting is supplied as the n well bias voltage of a p channel MOS•FET, there is the possibility that the latch-up phenomenon will occur.

An object of the present invention is to provide a technique capable of reducing the chip size of the semiconductor device.

The above and other objects and novel characteristics of the present invention will be apparent from the description of this specification and the accompanying drawings.

Outlines of the typical ones of the inventions disclosed in this application will be briefly described as follows.

That is, the present invention is a semiconductor device in which a field-effect transistor driven by a first supply voltage and a field-effect transistor driven by a second supply voltage larger in absolute value than said first supply voltage are provided in the same first well of the same semiconductor substrate, and said second supply voltage is supplied to said first well.

DESCRIPTION OF THE PREFERRED EMBODIMENTS

Figure 1:
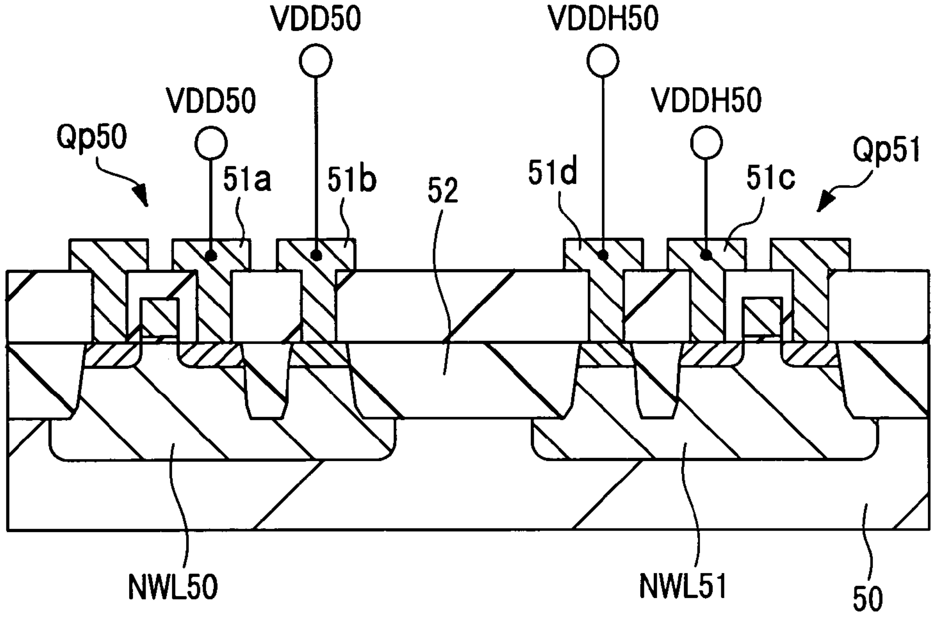
FIG. 1 is a partial sectional view showing an example of a semiconductor device examined by the present inventors.

Before the description of embodiments, basic meanings of terms used in the embodiments will be explained as follows.

The term "source voltage" indicates the voltage applied to an electrode that supplies carriers to a channel. In the following description of the embodiments, supply voltages are set to be VSSL<VSS<VDD<VDDH. In the p channel field-effect transistor, the supply voltage VDD or VDDH (VDD<VDDH) is used as source voltage. Also, in the n channel field-effect transistor, the supply voltage VSS or VSSL (VSS>VSSL) is used as source voltage.

In the embodiments described below, the invention will be described in a plurality of sections or embodiments when required as a matter of convenience. However, these sections or embodiments are not irrelevant to each other unless otherwise specified, and the one relates to the entire or a part of the other as a modified example, details, or a supplementary explanation thereof. Also, in the embodiments described below, when referring to the number of elements (including number of pieces, values, amount, range, and the like), the number of elements is not limited to a specific number unless otherwise specified and except the case where the number is apparently limited to a specific number in principle. The number larger or smaller than the specified number may be also applied. Further, in the embodiments described below, needless to say, the components (including element steps or the like) are not always indispensable unless otherwise specified and except the case where the components are apparently indispensable in principle. Similarly, in the embodiments described below, when the shapes of components, positional relations thereof, and the like are mentioned, the substantially approximate and similar shapes and the like are included therein unless otherwise specified and except the case where it can be conceived that they are apparently excluded in principle. This condition is also applicable to the numerical value and the range described above. Also, components having the same function are denoted by the same reference symbol throughout the drawings for describing the embodiments, and the repetitive description thereof will be omitted. Additionally, in the drawings used in the embodiments, hatching is used in some cases even in a plan view in order to make the drawings easy to see. Hereinafter, the embodiments of the present invention will be described in detail with reference to the accompanying drawings. Also, in these embodiments, the MIS•FET (Metal Insulator Semiconductor Field Effect Transistor) is abbreviated to “MIS”, and the p channel MIS•FET is abbreviated to “pMIS” and the n channel MIS•FET is abbreviated to “nMIS”.

(First Embodiment)

FIG. 1 is a partial sectional view showing an example of a semiconductor device examined by the present inventors. FIG. 1 illustrates the case where two pMISs Qp50 and Qp51 driven by different supply voltages are arranged close to each other on a main surface of a p semiconductor substrate 50. Supply voltage VDD50 is supplied to an electrode 51*a* and a well power-supply electrode 51*b* of one pMIS Qp50, and supply voltage. VDDH50 higher than the supply voltage VDD50 is applied to an electrode 51*c* and a well power-supply electrode 51*d* of the other pMIS Qp51. In this case, however, since the well bias voltage applied to an n well NWL50 and that applied to an n well NWL51 are different from each other, there is the possibility that a latch-up phenomenon will occur between the pMISs Qp50 and Qp51 if none of measures are taken. Therefore, it is necessary to provide a relatively wide isolation 52 between the pMISs Qp50 and Qp51 from the viewpoint of the inhibition or prevention of the latch-up phenomenon, and consequently there is the problem of provoking the increase in chip size.

Consequently, in this first embodiment, the same well bias voltage is applied to each of the MISs driven by the different supply voltages (source voltages). At this time, one source voltage, having the larger absolute value in the source voltages of the MISs driven by the different supply voltages, is selected as well bias voltage common to the respective MISs, and the selected voltage is applied to each of the wells. By so doing, since the latch-up phenomenon can be inhibited or prevented, an isolation interval between the adjacent MISs driven by the different supply voltages can be reduced. Therefore, it becomes possible to reduce the chip size.

Figure 2:
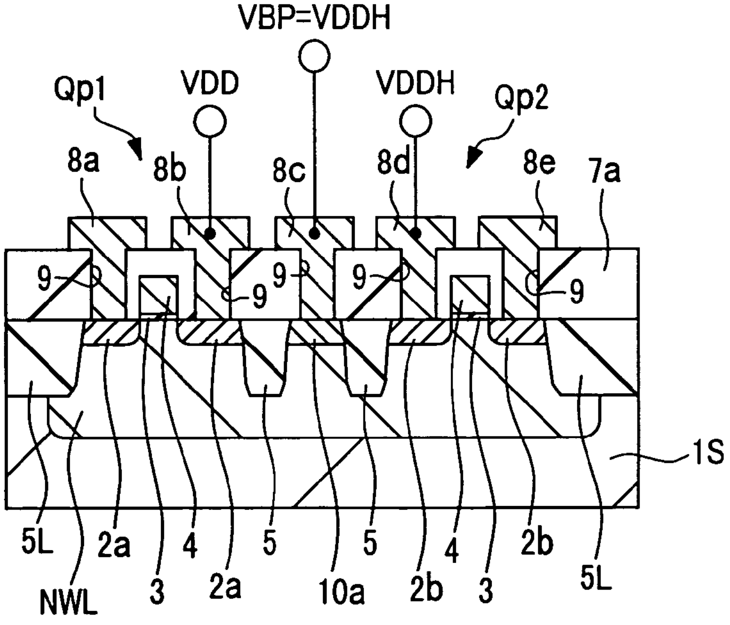
FIG. 2 is a sectional view showing the principal part of an example of a semiconductor device according to an embodiment of the present invention.

FIG. 2 is a partial sectional view showing a concrete example of the semiconductor device according to the first embodiment. FIG. 2 illustrates the case where a pMIS (first field-effect transistor) Qp1 driven by the supply voltage (first supply voltage) VDD and a pMIS (second field-effect transistor) Qp2 driven by the supply voltage (second supply voltage) VDDH higher than the supply voltage VDD are arranged so that they are adjacent to each other on a main surface (device surface) of a semiconductor substrate (referred to as “substrate” hereinafter) 1S made of, for example, p type silicon (Si) single crystal. The supply voltages VDD and VDDH are source voltages and also are positive voltages.

A PMIS Qp1 has $p^+$ semiconductor regions 2*a* for source and drain, a gate insulator 3, and a gate electrode 4. Additionally, a pMIS Qp2 also has $p^+$ semiconductor regions 2*b* for source and drain, a gate insulator 3, and a gate electrode 4. The semiconductor regions 2*a* and 2*b* are formed by implanting an impurity such as boron (B) or boron difluoride ($BF_2$) into a main surface side of the substrate 1S. The gate insulator 3 is made of, for example, a silicon oxide film ($SiO_2$ or the like) or silicon oxynitride film (SiON) or the like. The respective gate insulators 3 of the pMISs Qp1 and Qp2 are the same in thickness. The gate electrode 4 is composed of, for example, a single layer film of low-resistance polycrystalline silicon, or a multi-layer film obtained by forming a silicide layer such as cobalt silicide ($Co_xSi_y$) on a low-resistance polycrystalline silicon film, or a multi-layer film obtained by forming a metal film such as tungsten on a low-resistance polycrystalline silicon film via a barrier metal film such as tungsten nitride (WN).

In this first embodiment, the pMISs Qp1 and Qp2 driven by the different supply voltages as described above are arranged within a region of a common n well (first well) NWL. Further, the same well bias voltage VBP is applied to the n well NWL. In this case, the well bias voltage VBP is set at the relatively high supply voltage VDDH. A relatively narrow isolation (first isolation) 5 and a wider isolation (second isolation) 5L than it are formed, in a desired region on the main surface of the substrate 1S. According to the first embodiment, since the latch-up phenomenon can be inhibited or prevented, the width of the isolation 5 between the adjacent pMISs Qp1 and Qp2 can be made smaller than that of the isolation 5L (isolation 52 in FIG. 1). Therefore, the whole area occupied by the pMISs Qp1 and Qp2 including a well power-supply region can be made smaller than that in FIG. 1. As a result, it is possible to reduce the chip size. However, since the well bias voltage VBP of the pMIS Qp1 driven by the relatively low supply voltage VDD is set to the supply voltage VDDH in this case, substrate bias effect occurs on a side of the pMIS Qp1 and the threshold voltage of the pMIS Qp1 is increased. As a result, the operation speed of the pMIS Qp1 is reduced. So, in the first embodiment, the threshold voltage of the pMIS Qp1 is set lower than that of the pMIS Qp1 at the time when the supply voltage VDD is applied as the well bias voltage VBP. The adjustment of such threshold voltage can be made by controlling conditions (kind of impurities, dose amount, and the like) of the implantation of the impurity into a channel part (part of the substrate 1S just below the gate electrode 4) of the pMIS Qp1. As a result, the PMIS with relatively low threshold voltage is used as the pMIS Qp1 with relatively low source voltage, and the pMIS with relatively high threshold voltage is used as the pMIS Qp2 with relatively high source voltage (dual threshold voltage method).

The n well NWL is formed by implanting an impurity such as phosphorus (P) or arsenic (As) into the main surface side of the substrate 1S. The isolations 5 and 5L each have a trench structure (trench isolation) and are formed in the same process. More specifically, the isolation 5 is formed by embedding an insulation film in a trench dug in a thickness direction of the substrate 1S. However, the isolations 5 and 5L may be formed using a field insulation film formed by a LOCOS (Local Oxidization of Silicon) method. An insulator 7*a* made of, for example, silicon oxide is deposited over the main surface of the substrate 1S. Electrodes 8*a* to 8*e* made of metal such as aluminum (Al) or an aluminum alloy are formed on the insulator 7*a*. The electrodes 8*a* and 8*b* are electrically connected to the semiconductor regions 2*a* and 2*a* through contact holes 9 and 9, respectively. The supply voltage VSS is applied as reference voltage to the electrode 8*a*, and the supply voltage VDD higher than the supply voltage VSS is applied as source voltage to the electrode 8*b*. The electrode 8*c* is electrically connected to an $n^+$ semiconductor region 10*a* of the n well NWL through the contact hole 9. The well bias voltage VBP (=supply voltage VDDH) is applied to the electrode 8*c*. The electrodes 8*d* and 8*e* are electrically connected to the semiconductor regions 2*b* and 2*b* through the contact holes 9 and 9, respectively. The supply voltage VDDH is applied as source voltage to the electrode 8*d*, and the supply voltage VSS is applied as reference voltage to the electrode 8*e*. This supply voltage VSS is the earth voltage of, for example, 0 V.

The case where the electrode 8*c* for supplying the well bias voltage VBP is arranged between the adjacent pMISs Qp1 and Qp2 is shown in FIG. 2. However, the present invention is not limited to this, and the electrode 8*c* may be arranged on a side not adjacent to the pMISs Qp1 and Qp2 without arranging the electrode 8*c* between the adjacent pMISs Qp1 and Qp2, that is, on a left side of the pMIS Qp1 or a right side of the pMIS Qp2 of, for example, FIG. 2.

(Second Embodiment)

In a second embodiment, there will be described the case where a semiconductor device has the pMIS and nMIS provided on the same substrate, wherein it has either or both of two types of pMISs driven by different supply voltages and two types of nMISs driven by different supply voltages.

Figure 3:
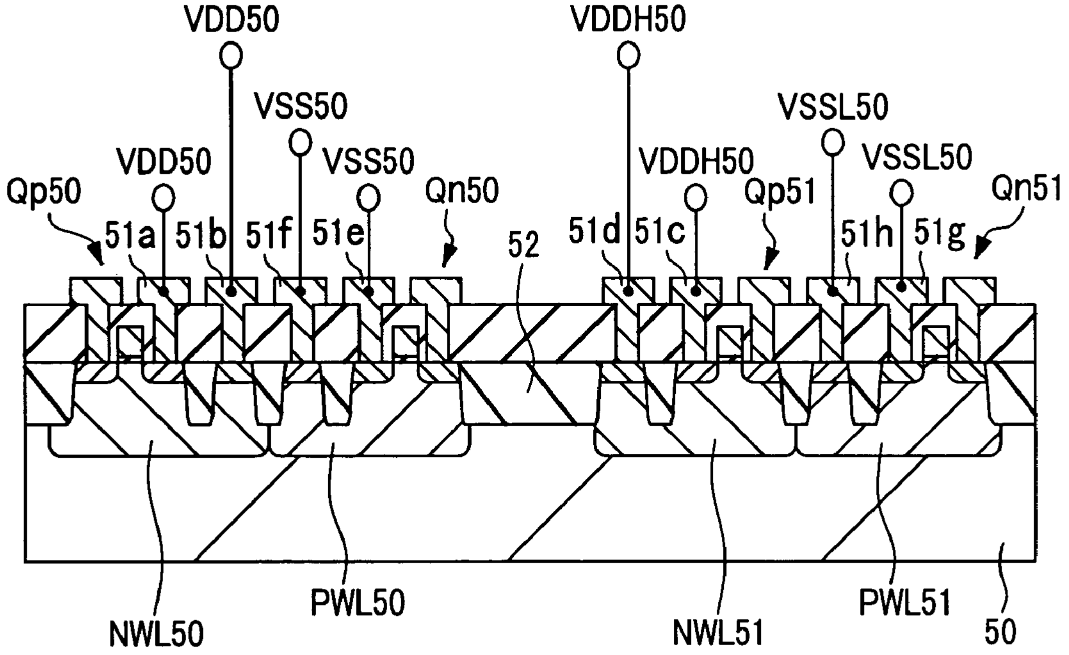
FIG. 3 is a partial sectional view showing another example of a semiconductor device examined by the present inventors.
Figure 4:
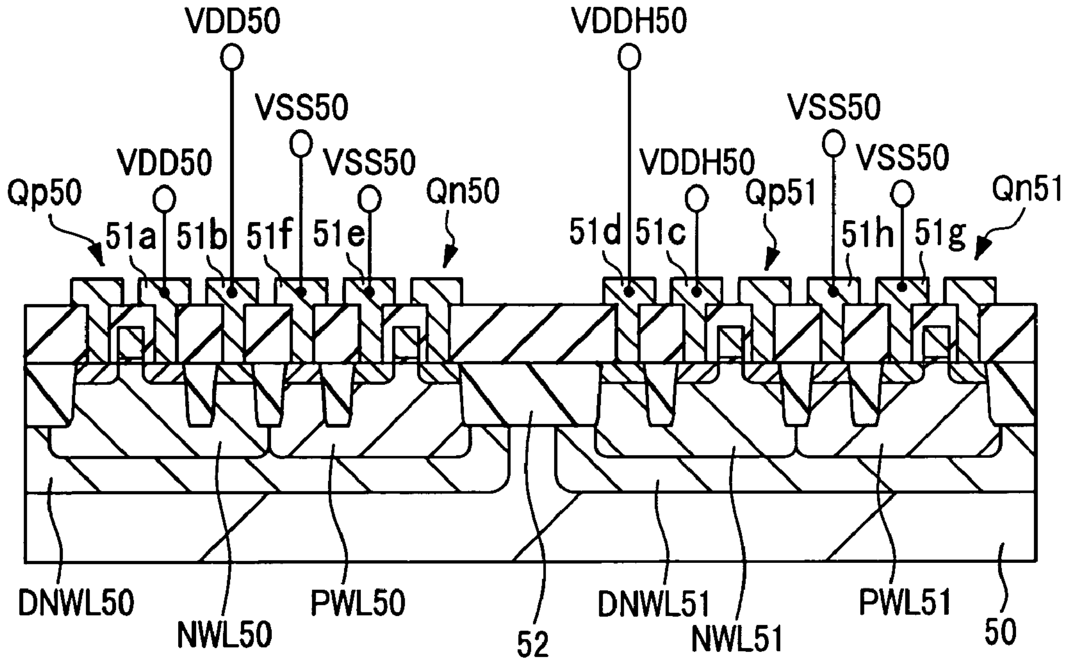
FIG. 4 is a partial sectional view showing still another example of a semiconductor device examined by the present inventors.

FIG. 3 is a partial sectional view showing a concrete example of a semiconductor device examined by the present inventors. FIG. 3 illustrates the case where two types of pMISs Qp50 and Qp51 driven by different supply voltages and two types of nMISs Qn50 and Qn51 driven by different supply voltages are arranged on a main surface of the same substrate 50. Supply voltage VSS50 is supplied to an electrode 51*e* and a well power-supply electrode 51*f* of one nMIS Qn50, and reference supply voltage VSSL50 lower than the supply voltage VSS50 is applied to an electrode 51*g* and a well power-supply electrode 51*h* of the other nMIS Qn51. At this time, the pMISs Qp50 and Qp51 and the nMISs Qn50 and Qn51 are alternately arranged. Since n wells NWL50 and NWL51 and p wells PWL50 and PWL51 are alternately arranged in this case, it seems unnecessary to provide a wide isolation 52 between the nMIS Qn50 and pMIS Qp51. Practically, however, there is the possibility that the p well PWL50 and the p well PWL51 will be electrically connected through the p substrate 50 and the latch-up phenomenon will occur therebetween. Therefore, it is necessary to provide the wide isolation 52 between the nMIS Qn50 and pMIS Qp51 in order to inhibit or prevent the latch-up phenomenon. Also, FIG. 4 illustrates the case where a buried n well DNWL50 is provided at a position deeper than the positions of the p wells PWL50 and PWL51 and the n wells NWL50 and NWL51. In this case, the n wells NWL50 and NWL51 are physically separated from each other, but are electrically connected through the buried n well DNWL50. Therefore, there is the possibility that the latch-up phenomenon will occur. Accordingly, it is necessary to provide the wide isolation 52 between the nMIS Qn50 and the pMIS Qp51 in order to inhibit or prevent the latch-up phenomenon. As a result, there is the problem of provoking the increase in the chip size also in both cases shown in FIGS. 3 and 4.

For this reason, in the second embodiment, in the case where the wells in which each of the MISs is arranged are electrically connected to each other through the substrate or the buried well or the like even though the MISs driven by the different supply voltages (source voltages) are physically separated from each other, the same well bias voltage is applied to each of the wells in which the MISs driven by the different supply voltages are arranged. The well bias voltage is selected in the same manner as that in the first embodiment. By so doing, since the latch-up phenomenon can be inhibited or prevented similarly to the first embodiment, the isolation interval between the MISs driven by the different supply voltages can be reduced. As a result, it is possible to reduce the chip size.

Figure 5:
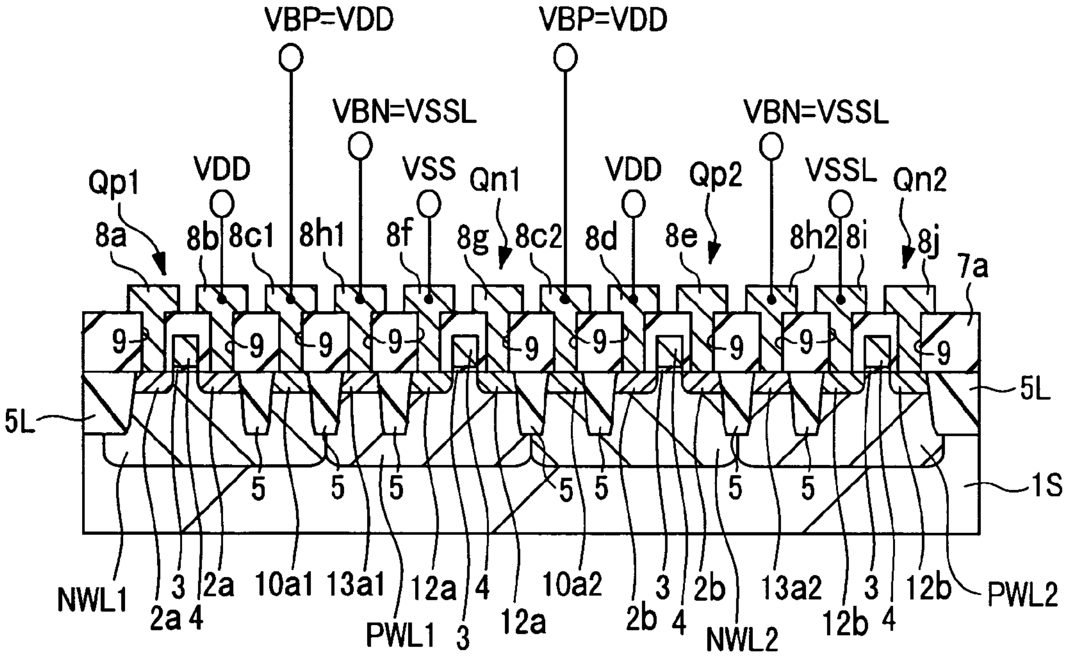
FIG. 5 is a sectional view showing the principal part of an example of a semiconductor device according to another embodiment of the present invention.

FIGS. 5 to 10 are sectional views showing the concrete examples of the principal part of the semiconductor device according to the second embodiment. FIG. 5 shows the case where the pMISs Qp1 and Qp2 and the nMISs (fifth, sixth, and seventh field-effect transistors) Qn1 and Qn2 are alternately arranged along the main surface of the substrate 1S. On the main surface side of the substrate 1S, the n wells NWL1 and NWL2 and the p wells PWL1 and PWL2 are alternately arranged along the main surface of the substrate 1S. Since each structure of the n wells NWL1 and NWL2 is identical to that of the n well NWL described above, the description thereof is omitted here. The pMISs Qp1 and Qp2 are arranged in the n wells NWL1 and NWL2, respectively. The case where the pMISs Qp1 and Qp2 are driven by the same supply voltage (source voltage) VDD is shown here. The supply voltage VSS is applied as reference voltage to the electrodes 8*a* and 8*e*. The supply voltage VSS is the earth voltage of, for example, 0 V. The supply voltage VDD higher than the supply voltage VSS is applied as source voltage to the electrodes 8*b* and 8*d*. Electrodes 8*c*1 and 8*c*2 are electrically connected to $n^+$ semiconductor regions 10*a*1 and 10*a*2 through the contact holes 9 and 9 and also connected to the n wells NWL1 and NWL2 therethrough, respectively. The supply voltage VDD is applied as the well bias voltage VBP to the electrodes 8*c*1 and 8*c*2.

Meanwhile, the p wells PWL1 and PWL2 are each formed by implanting an impurity such as boron (B) or boron difluoride ($BF_2$) into the main surface side of the substrate 1S. The nMISs Qn1 and Qn2 are arranged in the p wells PWL1 and PWL2, respectively. The nMIS Qn1 has $n^+$ semiconductor regions 12*a* for source and drain, a gate insulator 3, and a gate electrode 4. Additionally, the nMIS Qn2 also has $n^+$ semiconductor regions 12*b* for source and drain, a gate insulator 3, and a gate electrode 4. The semiconductor regions 12*a* and 12*b* are each formed by implanting an impurity such as phosphorus or arsenic into the main surface side of the substrate 1S. The case where the nMISs Qn1 and Qn2 are driven by the different supply voltages (source voltages) VSS and VSSL is illustrated here. The supply voltage VSS is applied as source voltage to an electrode 8*f* of the nMIS Qn1. The supply voltage VSS is the earth voltage of, for example, 0 V. The negative supply voltage VSSL lower than the supply voltage VSS is applied as source voltage to an electrode 8*i* of the nMIS Qn2. The absolute value of the supply voltage VSSL is larger than that of the supply voltage VSS. Electrodes 8*h*1 and 8*h*2 are electrically connected to $p^+$ semiconductor regions 13*a*1 and 13*a*2 through the contact holes 9 and 9 and are electrically connected to the p wells PWL1 and PWL2 therethrough, respectively. Although the p wells PWL1 and PWL2 are physically separated from each other, they are electrically connected through the p substrate 1S. Therefore, there is the possibility that the latch-up phenomenon will occur therebetween when the different well bias voltages are applied to the p wells PWL1 and PWL2. Accordingly, it is necessary to arrange the wide isolation between the p wells PWL1 and PWL2 as shown in FIG. 3. As a result, the chip size is increased. For this reason, in this second embodiment, the same supply voltage (source voltage) VSSL is applied as the well bias voltage VBN to the electrodes 8*h*1 and 8*h*2. By so doing, since the latch-up phenomenon can be inhibited or prevented, the width of the isolation 5 between the p wells PWL1 and PWL2 can be reduced. Therefore, the whole area occupied by the pMISs Qp1 and Qp2 and the nMISs Qn1 and Qn2 including the well power-supply region can be made smaller than that in FIG. 3. As a result, it becomes possible to reduce the chip size more than the case in FIG. 3. However, also in this case, since the well bias voltage VBN of the nMIS Qn1 driven by the supply voltage VSS is the supply voltage VSSL, the substrate bias effect occurs on the side of the nMIS Qn1 and the threshold voltage of the nMIS Qn1 is increased and, consequently, the operation speed of the nMIS Qn1 is reduced. For this reason, in the second embodiment, the threshold voltage of the nMIS Qn1 is set lower than that of the nMIS Qn1 at the time when the supply voltage VSS is applied as the well bias voltage VBN. The adjustment of such threshold voltage can be made in the same manner as in the first embodiment. As a result, the nMIS with relatively low threshold voltage is used as the nMIS Qn1, and the nMIS with relatively high threshold voltage is used as the nMIS Qn2.

Figure 6:
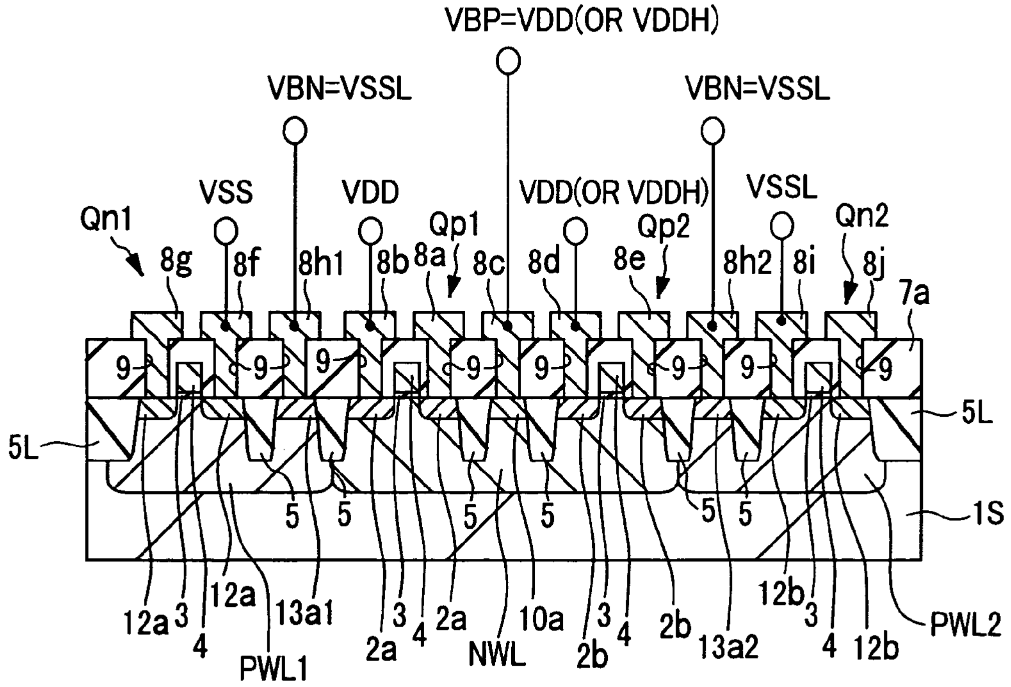
FIG. 6 is a sectional view showing the principal part of another example of a semiconductor device according to another embodiment of the present invention.

Next, FIG. 6 illustrates the case where the pMISs Qp1 and Qp2 are arranged so that they are adjacent to each other. In FIG. 6, the n well NWL of the pMISs Qp1 and Qp2 is a common well and the p wells PWL1 and PWL2 of the nMISs Qn1 and Qn2 are respectively arranged on both sides of the n well NWL. In this case, since the n well NWL is arranged between the p wells PWL1 and PWL2, the distance between the p wells PWL1 and PWL2 is longer than that in FIG. 5. However, similarly to the case of FIG. 5, the same supply voltage (source voltage) VSSL is applied as the well bias voltage VBN to the p wells PWL1 and PWL2 from the viewpoint of the inhibition and the prevention of the latch-up phenomenon. By so doing, since it becomes possible to inhibit or prevent the latch-up phenomenon, the width of the isolation 5 between the p wells PWL1 and PWL2 can be reduced. Therefore, the whole area occupied by the pMISs Qp1 and Qp2 and the nMISs Qn1 and Qn2 including the well power-supply region can be made smaller than that in FIG. 3. As a result, it becomes possible to reduce the chip size more than that in FIG. 3. Also, the case where the pMIS Qp1 is driven by the supply voltage VDD and the pMIS Qp2 is driven by the supply voltage VDD or the supply voltage VDDH higher than the voltage VDD is shown in FIG. 6. If the source voltage of the pMIS Qp2 is the supply voltage VDD, the supply voltage VDD is applied as the well bias voltage VBP to the common n well NWL through the electrode 8*c* and the $n^+$ semiconductor region 10*a*, and if the source voltage of the pMIS Qp2 is the supply voltage VDDH, the supply voltage VDDH higher than the supply voltage VDD is applied as the well bias voltage VBP to the common n well NWL through the electrode 8*c* and the $n^+$ semiconductor region 10*a*. The well power-supply region is provided to each of the pMISs Qp1 and Qp2 in FIG. 5. On the other hand, the well power-supply region of the pMISs Qp1 and Qp2 is a common region in FIG. 6. Therefore, the whole area occupied by the pMISs Qp1 and Qp2 and the nMISs Qn1 and Qn2 including the well power-supply region in the case in FIG. 6 can be made further smaller than that in FIG. 5, whereby the chip size can be reduced more than that in FIG. 5.

Figure 7:
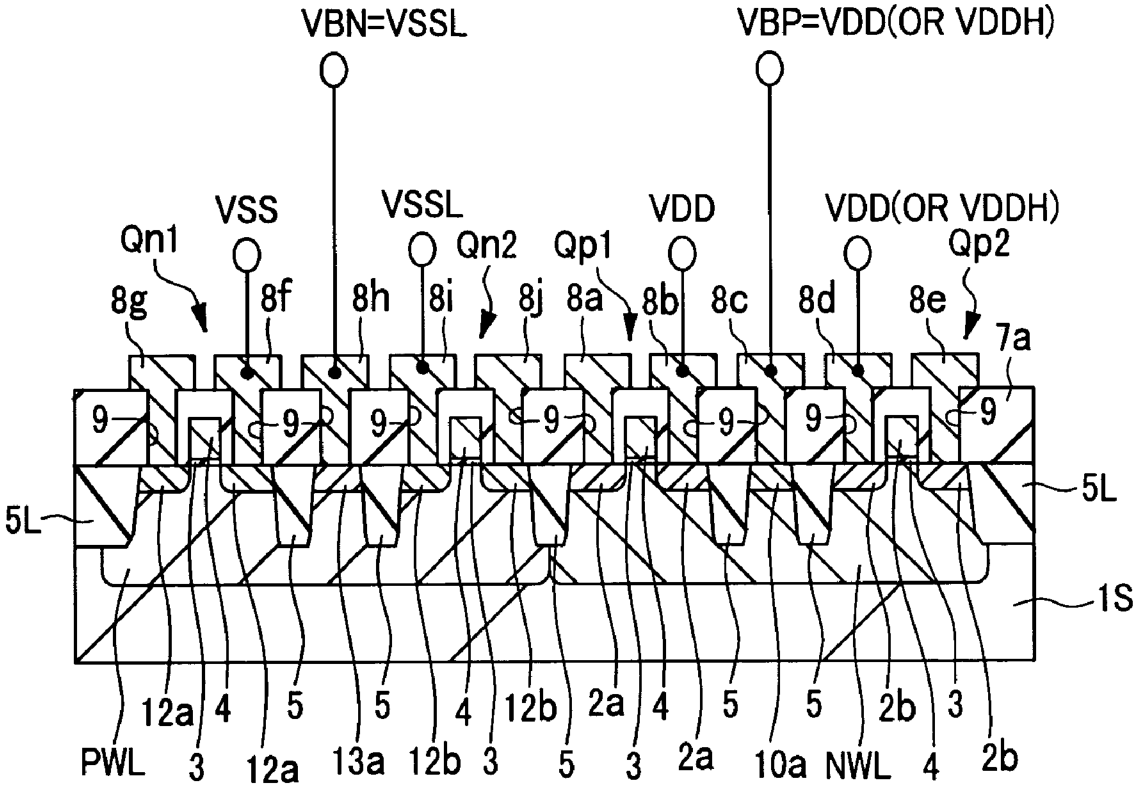
FIG. 7 is a sectional view showing the principal part of another example of a semiconductor device according to another embodiment of the present invention.

Next, FIG. 7 illustrates the case where the pMISs Qp1 and Qp2 are arranged so as to be adjacent to each other and the nMISs Qn1 and Qn2 are arranged so as to be adjacent to each other. To be different from the case shown in FIG. 6 is that the p well PWL of the nMISs Qn1 and Qn2 becomes also a common well. The same supply voltage VSSL is applied as the well bias voltage VBN to the common p well PWL through an electrode 8*h* and a $p^+$ semiconductor region 13*a*. Since the p well PWL of the nMISs Qn1 and Qn2 is a common one in FIG. 7, the well power-supply region to the p well PWL is also a common one. Therefore, in the case shown in FIG. 7, the whole area occupied by the pMISs Qp1 and Qp2 and the nMISs Qn1 and Qn2 including the well power-supply region can be made smaller than that in FIG. 6, whereby the chip size can be reduced more than that in FIG. 6.

Figure 8:
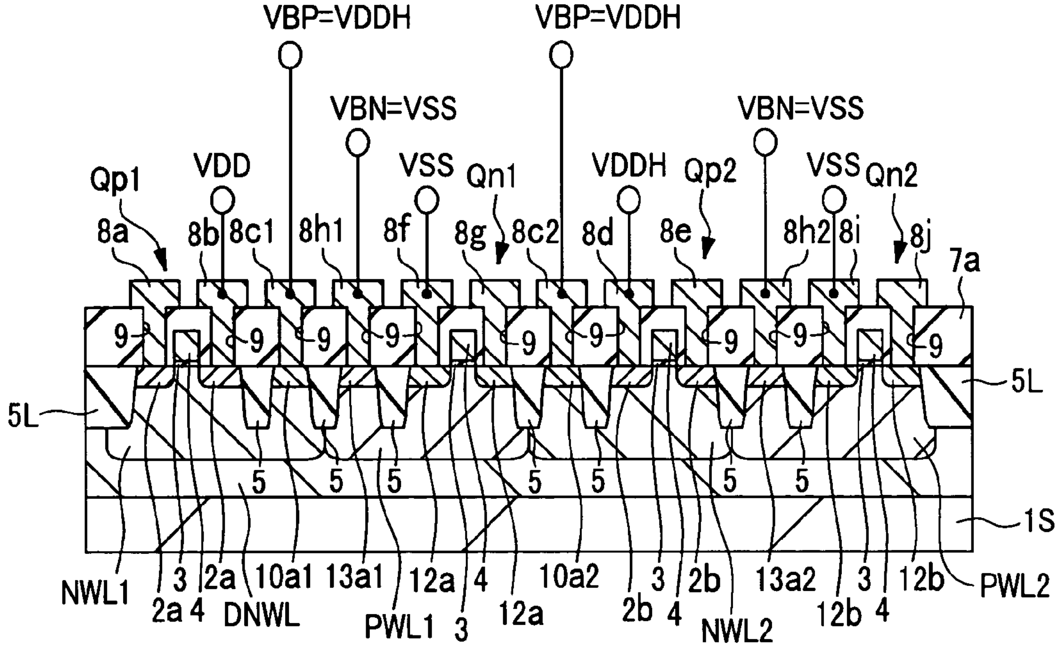
FIG. 8 is a sectional view showing the principal part of another example of a semiconductor device according to another embodiment of the present invention.
Figure 9:
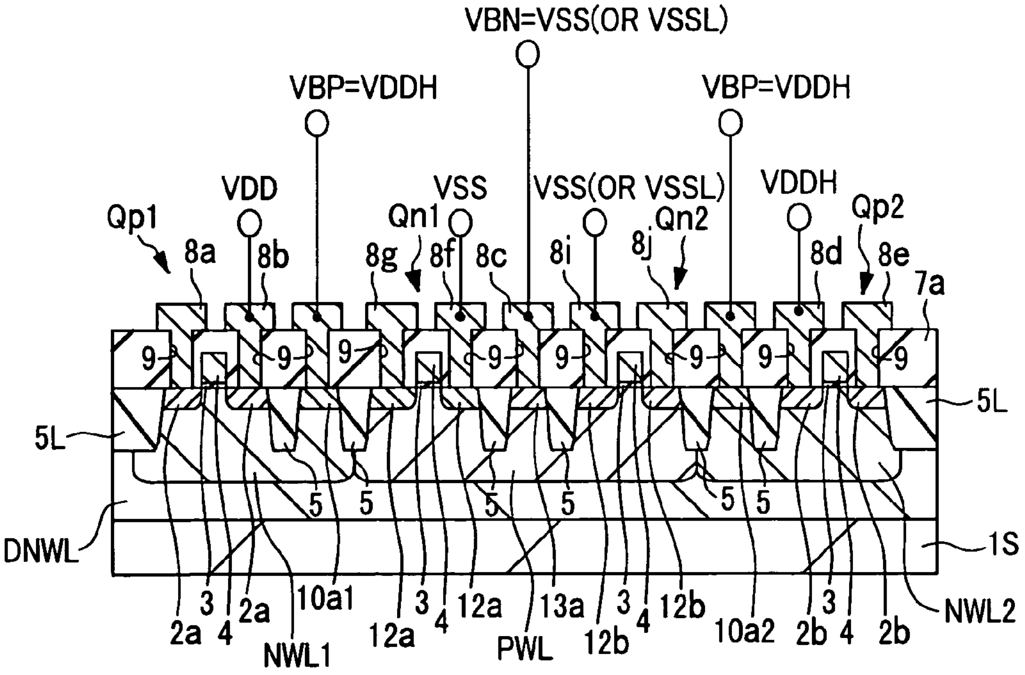
FIG. 9 is a sectional view showing the principal part of another example of a semiconductor device according to another embodiment of the present invention.
Figure 10:
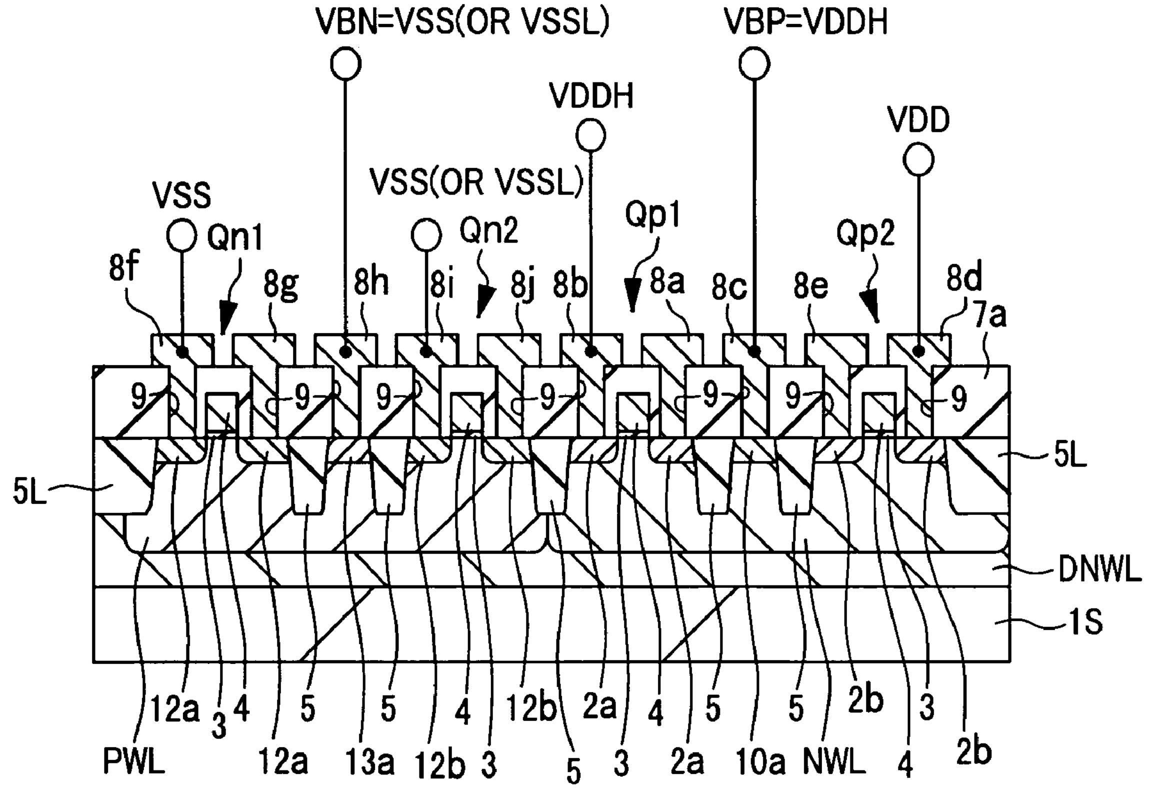
FIG. 10 is a sectional view showing the principal part of still another example of a semiconductor device according to another embodiment of the present invention.

Next, FIGS. 8 to 10 show a concrete example where the buried n well DNWL is provided in the p substrate 1S. Similarly to FIG. 5, FIG. 8 illustrates the case where the pMISs Qp1 and Qp2 and the nMISs Qn1 and Qn2 are alternately arranged along the main surface of the substrate 1S. The n wells NWL1 and NWL2 and the p wells PWL1 and PWL2 are respectively provided so that they are enclosed within the buried n well DNWL, and each of the wells is electrically isolated from the p substrate 1S by this buried n well DNWL. Also, the case where the pMISs Qp1 and Qp2 are driven by the different supply voltages (source voltages) VDD and VDDH is illustrates here. The supply voltage VSS is applied as reference voltage to the electrodes 8*a* and 8*e*. The supply voltage VSS is the earth voltage of, for example, 0 V. The supply voltage VDD higher than the supply voltage VSS is applied as source voltage to the electrode 8*b*, and the supply voltage VDDH higher than the supply voltage VDD is applied as source voltage to the electrode 8*d*. Further, although the n wells NWL1 and NWL2 are physically separated from each other in this case, they are electrically connected through the buried n well DNWL. Therefore, the same supply voltage VDDH is applied as the well bias voltage VBP to the n wells NWL1 and NWL2 through the electrodes 8*c*1 and 8*c*2 from the viewpoint of the inhibition and the prevention of the latch-up phenomenon. By so doing, the latch-up phenomenon can be inhibited or prevented, so that it is possible to reduce the width of the isolation 5 between the n wells NWL1 and NWL2. Accordingly, the whole area occupied by the pMISs Qp1 and Qp2 and the nMISs Qn1 and Qn2 including the well power-supply region can be made smaller than that in FIG. 4, so that it becomes possible to reduce the chip size more than that in FIG. 4. Also, the case where the nMISs Qn1 and Qn2 are driven by the same supply voltage (source voltage) VSS is shown here. The supply voltage VSS is applied as source voltage to the electrodes 8*f* and 8*i* of the nMISs Qn1 and Qn2. The supply voltage VSS is the earth voltage, for example, a voltage of 0 V. The supply voltage VSS is applied as the well bias voltage VBN to the electrodes 8_h_1 and 8_h_2.

Next, FIG. 9 illustrates the case where the nMISs Qn1 and Qn2 are arranged so that they are adjacent to each other. In FIG. 9, the p well PWL of the nMISs Qn1 and Qn2 is a common well and the n wells NWL1 and NWL2 of the pMISs Qp1 and Qp2 are respectively arranged on both sides of the p well PWL. In this case, since the p well PWL is arranged between the n wells NWL1 and NWL2, the distance between the n wells NWL1 and NWL2 is longer than that in FIG. 8. However, similarly to the case of FIG. 8, the same supply voltage (source voltage) VDDH is applied as the well bias voltage VBP to the n wells NWL1 and NWL2 from the viewpoint of the inhibition and the prevention of the latch-up phenomenon. By so doing, since the latch-up phenomenon can be inhibited or prevented, the width of the isolation 5 between the n wells NWL1 and NWL2 can be reduced. Accordingly, the whole area occupied by the pMISs Qp1 and Qp2 and the nMISs Qn1 and Qn2 including the well power-supply region can be made smaller than that in FIG. 4, whereby it becomes possible to reduce the chip size more than that in FIG. 4. Also, the case where the nMIS Qn1 is driven by the supply voltage VSS and the nMIS Qn2 is driven by the supply voltage VSS or the supply voltage VSSL lower than the voltage VSS is shown in FIG. 9. If the source voltage of the nMIS Qn2 is the supply voltage VSS, the supply voltage VSS is applied as the well bias voltage VBN to the common p well PWL through the electrode 8_c_ and the $p^+$ semiconductor region 13_a_, and if the source voltage of the nMIS Qn2 is the supply voltage VSSL, the supply voltage VSSL larger in absolute value than the supply voltage VSS is applied as the well bias voltage VBN to the common p well PWL through the electrode 8_c_ and the $p^+$ semiconductor region 13_a_. The well power-supply region is provided to each of the nMISs Qn1 and Qn2 in FIG. 8. On the other hand, the well power-supply region of the nMISs Qn1 and Qn2 is a common region in FIG. 9. Therefore, in the case shown in FIG. 9, the whole area occupied by the pMISs Qp1 and Qp2 and the nMISs Qn1 and Qn2 including the well power-supply region can be made smaller than that in FIG. 8, so that it becomes possible to reduce the chip size more than that in FIG. 8.

Next, FIG. 10 illustrates the case where the pMISs Qp1 and Qp2 are arranged so as to be adjacent to each other and the nMISs Qn1 and Qn2 are arranged so as to be adjacent to each other. To be different from the case in FIG. 9 is that the n well NWL of the pMISs Qp1 and Qp2 is also a common well. The same supply voltage VDDH is applied as the well bias voltage VBP to the common n well NWL through the electrode 8_c_ and the $n^+$ semiconductor region 10_a_. Since the n well NWL of the pMISs Qp1 and Qp2 is a common well in FIG. 10, the well power-supply region to the n well NWL is also a common well. Therefore, in the case shown in FIG. 10, the whole area occupied by the pMISs Qp1 and Qp2 and the nMISs Qn1 and Qn2 including the well power-supply region can be made smaller than that in FIG. 9, whereby it becomes possible to reduce the chip size more than that in FIG. 9.

(Third Embodiment)

The case where the present invention is applied to an SRAM (Static Random Access Memory) will be described in a third embodiment.

Figure 11:
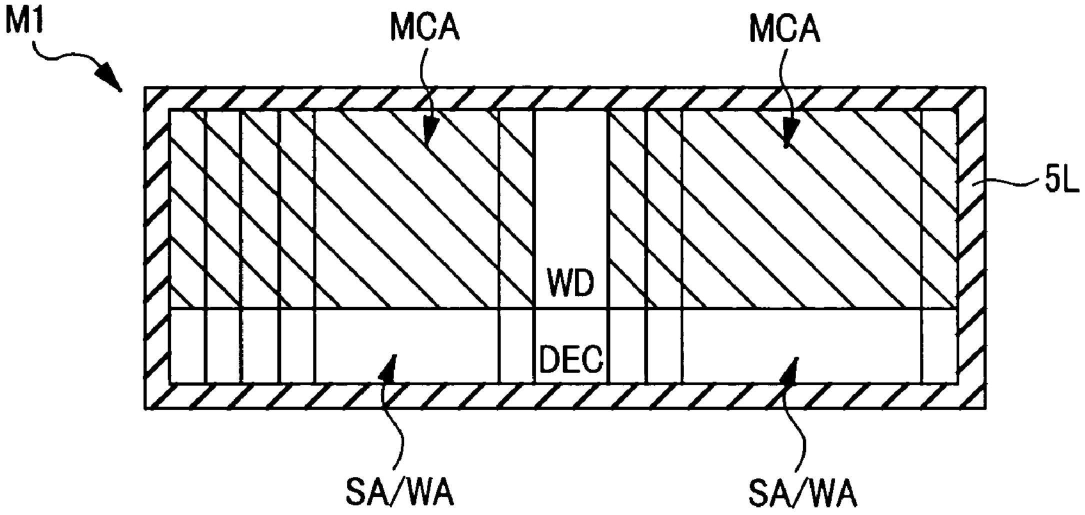
FIG. 11 is a plan view showing an example of an SRAM macro arranged on a part of a semiconductor chip of a semiconductor device according to another embodiment of the present invention.
Figure 12:
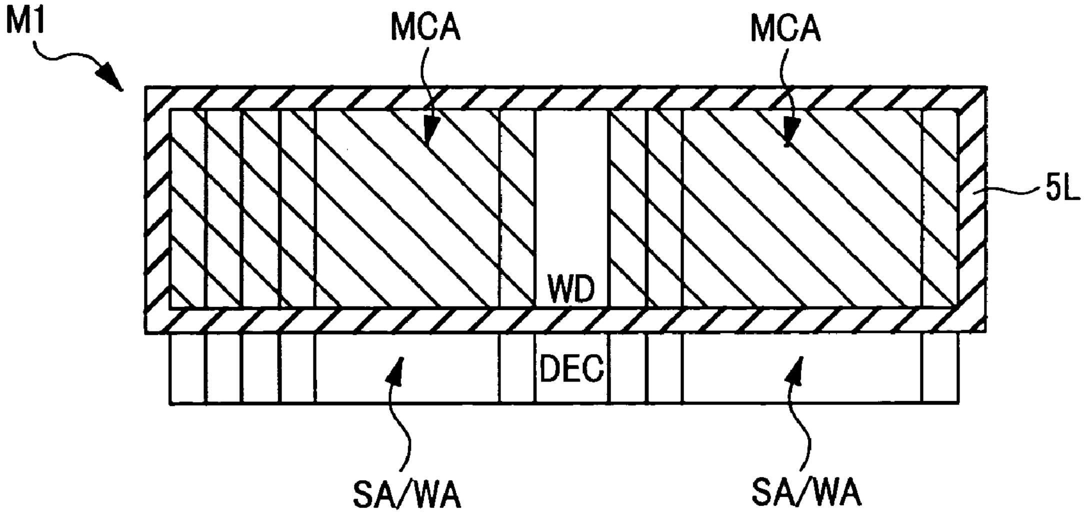
FIG. 12 is a plan view showing anther example of an SRAM macro arranged on a part of a semiconductor chip of a semiconductor device according to another embodiment of the present invention.

FIGS. 11 and 12 are plan views showing examples of an SRAM macro M1 arranged in a part of a semiconductor chip. The reference symbol "MCA" denotes a memory cell array (hatched area), "WD" a word driver circuit area, "DEC" a decoder circuit area, and "SA/WA" a sense amplifier/write amplifier circuit area. The pMIS driven by the relatively high supply voltage VDDH is arranged in the hatched area, and the pMIS driven by the relatively low supply voltage VDD is arranged in a not hatched area.

Figure 13:
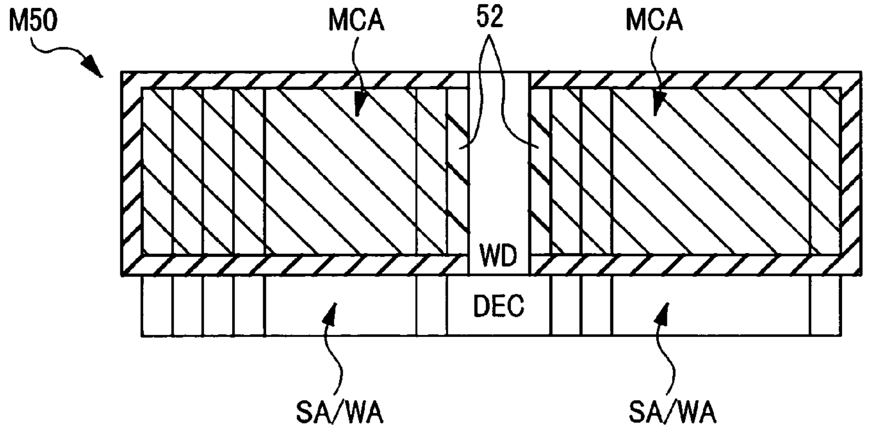
FIG. 13 is a plan view of a standard SRAM macro.

In this third embodiment, the well bias voltages of the pMISs of which the respective source voltages are the supply voltages VDD and VDDH (VDDH>VDD) in the SRAM macro M1 are set to the supply voltage VDDH as described in the first and second embodiments. In an area other than the SRAM macro M1 of the semiconductor chip, the source voltage of the pMIS is set to the supply voltage VDD, and the well bias voltage of the pMIS is set to the supply voltage VDD. A structure in which the whole of the SRAM macro M1 is surrounded by the isolation 5L is shown in FIG. 11, and a structure in which the memory cell array MCA and the word driver circuit area WD of the SRAM macro M1 are surrounded by the isolation 5L and the decoder circuit area DEC and the sense amplifier/write amplifier circuit area are arranged outside the isolation 5L is shown in FIG. 12. The plan view of the standard SRAM macro M50 is shown in FIG. 13 for comparison. Since the area of the isolation 52 between the adjacent memory cell arrays MCA in FIG. 13 can be eliminated in the examples shown in FIGS. 11 and 12, it is possible to reduce the area occupied by the SRAM macro M1. Therefore, it becomes possible to reduce the chip size. Also, according to the third embodiment, in an area other than the SRAM macro M1 of the semiconductor chip, the isolation 5 shown in FIGS. 11 and 12 can be eliminated by setting the source voltage of the pMIS to the supply voltage VDD and setting the well bias voltage of the pMIS to the supply voltage VDDH and, further, the area of the SRAM macro M1 can be reduced, whereby it is possible to further reduce the chip size.

Figure 14:
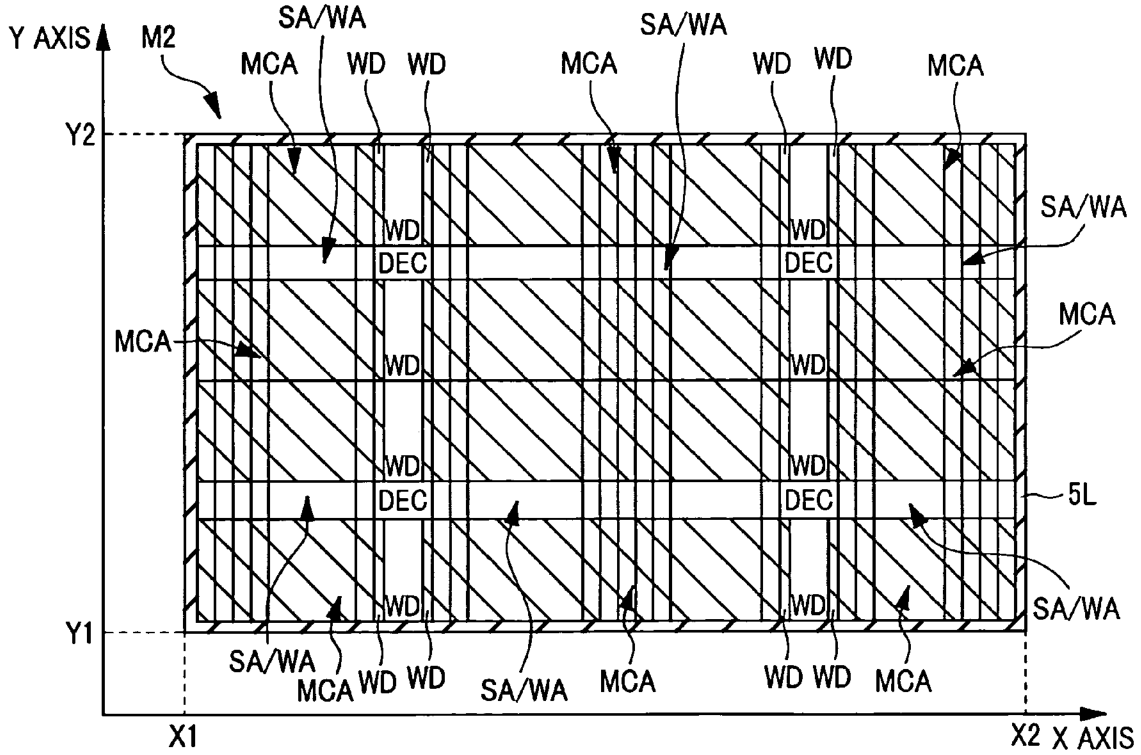
FIG. 14 is a plan view showing still another example of an SRAM macro arranged on a part of a semiconductor chip of a semiconductor device according to another embodiment of the present invention.
Figure 15:
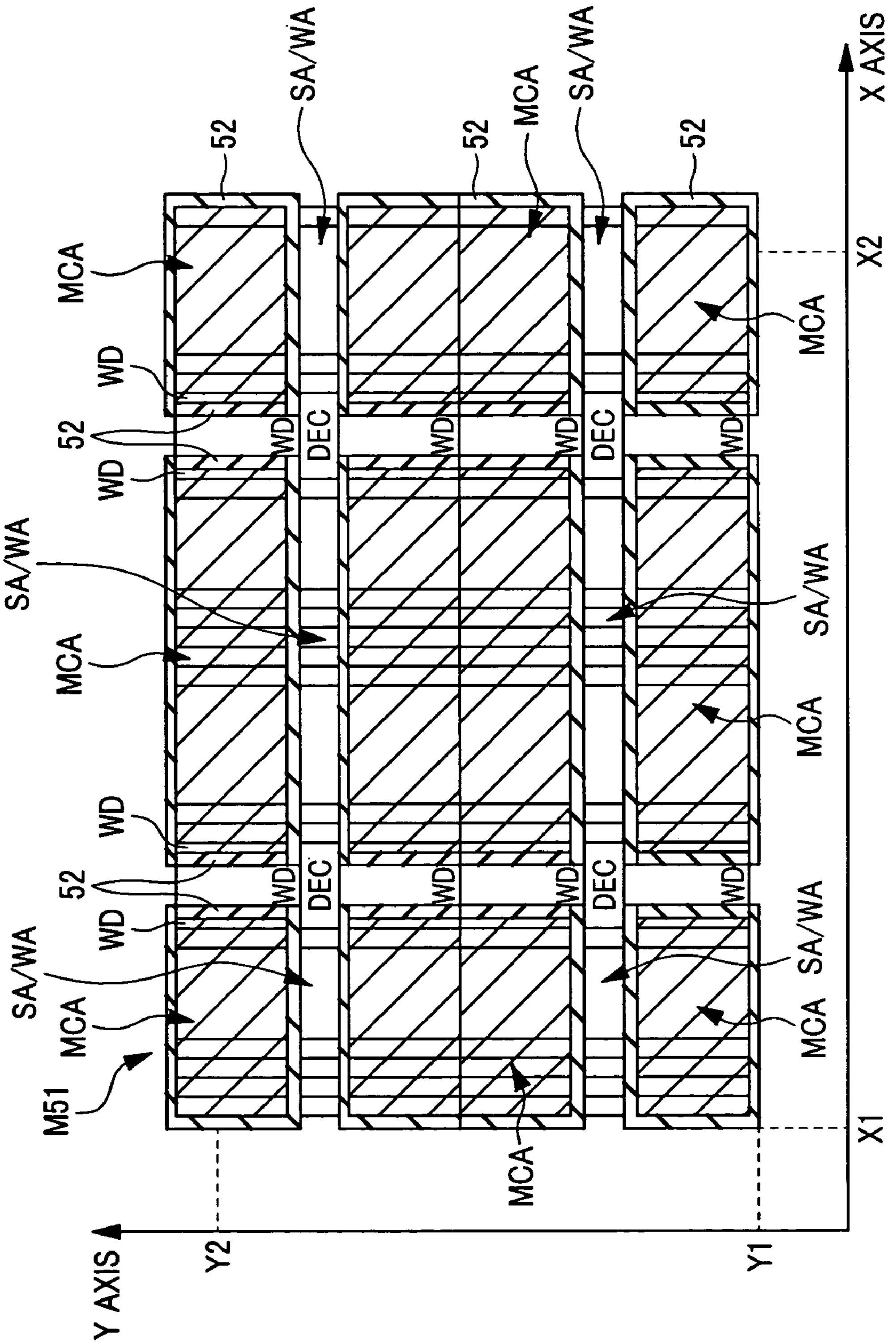
FIG. 15 is a plan view of a standard SRAM macro in which a plurality of memory cell arrays are arranged.

Next, FIG. 14 shows an SRAM macro M2 in which a plurality of memory cell arrays MCA described above are aligned. Also, FIG. 15 shows a plan view of a standard SRAM macro M51 in which a plurality of memory cell arrays MCA are aligned for comparison. X and Y axes are shown in FIGS. 14 and 15 to compare the sizes of the SRAM macros M2 and M51. The pMIS driven by relatively high supply voltage is arranged in a hatched area. The case where the memory cell arrays MCA and the word driver circuits having the pMIS driven by the high supply voltage VDDH are arranged in the hatched area is shown here. The pMIS driven by the relatively low supply voltage VDD is arranged in a not hatched area. Also in this case, the well bias voltages of the pMISs of which source voltages are the supply voltages VDD and VDDH (VDDH>VDD) in the SRAM macro M2 are set to the supply voltage VDDH as described in the first and second embodiments. In an area other than the SRAM macro M2 of the semiconductor chip, the source voltage of the pMIS is set to the supply voltage VDD, and the well bias voltage of the pMIS is set to the supply voltage VDD. As seen by the comparison of FIGS. 14 and 15, the areas of the isolations 52 between the memory cell arrays MCA, which are adjacent to one another on upper-down and left-right sides in FIG. 15, can be eliminated in accordance with the example shown in FIG. 14. Therefore, the area occupied by the SRAM macro M2 can be reduced, whereby the chip size can be reduced. Thus, the effects of the reduction of the area occupied by the SRAM macro become prominent as the number of the memory cell arrays is increased. Since memory capacity of the SRAM macro tends to increase, the structure according to the third embodiment is effective in achieving the reduction of the chip size.

Figure 16:
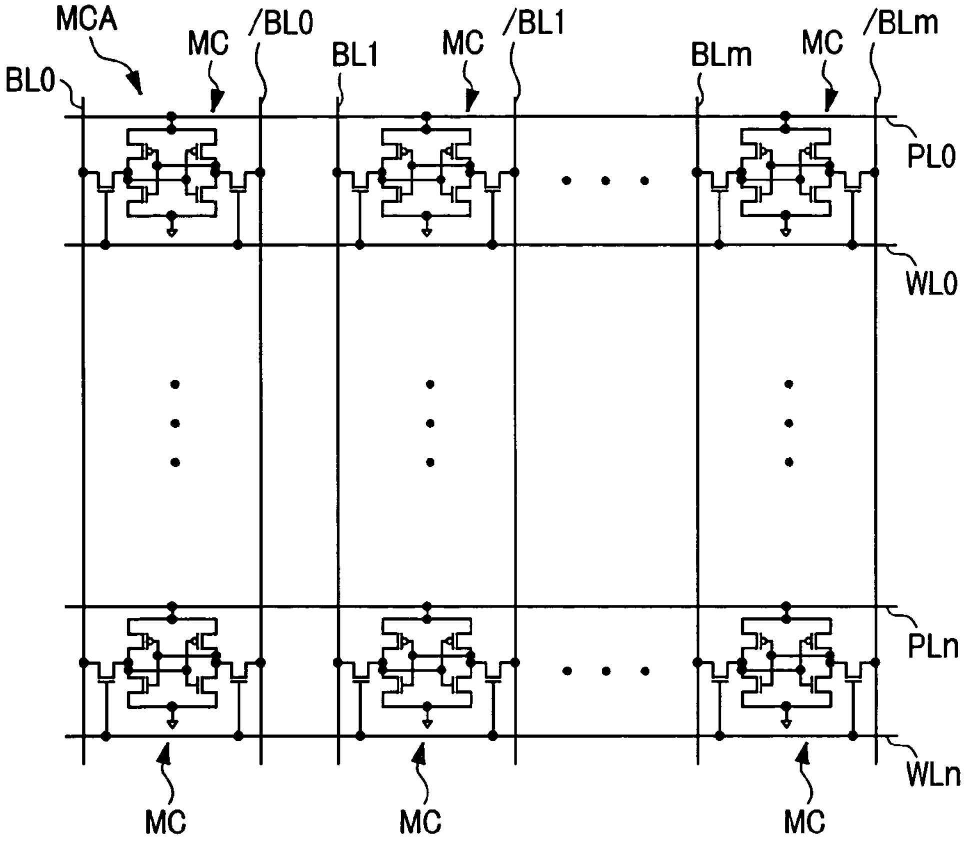
FIG. 16 is a circuit diagram showing an example of the memory cell array in FIGS. 11, 12, and 14.
Figure 17:
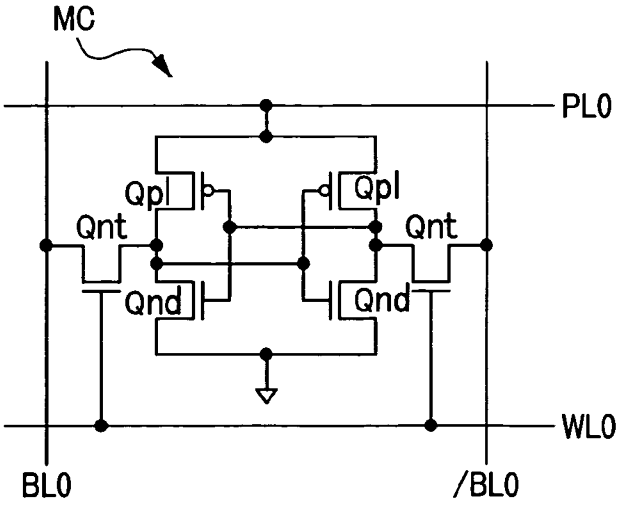
FIG. 17 is an enlarged circuit diagram showing the memory cell of the memory cell array in FIG. 16.

FIG. 16 is a circuit diagram showing an example of the memory cell array MCA in FIGS. 11, 12, and 14, and FIG. 17 is an enlarged diagram of the memory cell MC of the memory cell array MCA in FIG. 16. In the memory cell array MCA, there are arranged: a plurality of word lines WL0 to WLn and a plurality of cell power-supply lines PL0 to PLn extending in the left-right direction of FIGS. 16 and 17; a plurality of bit lines BL0 and /BL0 to BLm and /BLm extending in the direction vertical thereto; and memory cells MC arranged near respective intersections between the word lines WL0 to WLn and cell power-supply lines PL0 to PLn and the bit lines BL0 and /BL0 to BLm and /BLm. The word lines WL0 to WLn are electrically connected to the word driver circuit and an X decoder circuit of the decoder circuit. The bit lines BL0 and /BL0 to BLm and /BLm are electrically connected to a Y decoder circuit of the decoder circuit and the sense amplifier circuit. There is illustrated a so-called CMIS (Complementary MIS) type SRAM cell having six MISs, in which the memory cell MC includes two nMISs Qnd for drive, two nMISs Qnt for transfer, and two pMISs Qp1 for load. The supply voltage VDDH is supplied as source voltage to each of the pMISs Qp1 of the memory cells MC through the cell power-supply lines PL0 to PLn. As described with reference to FIGS. 8 to 10 in the second embodiment, the sectional structure having the buried n well DNWL is preferable. This is because resistance to α ray can be improved and thus soft error of the memory cell MC due to the α ray can be inhibited or prevented. Though not particularly limited, the power supply voltage VSS is the earth voltage of, for example, 0 V and the supply voltage VSSL is, for example, approximately −0.4 V and the supply voltage VDD is, for example, approximately 0.8 V and the supply voltage VDDH is, for example, approximately 1.2 V.

(Fourth Embodiment)

In a fourth embodiment, the case where both of a shared well supply voltage method and an isolated well supply voltage method are mixed on the same substrate will be described.

Figure 18:
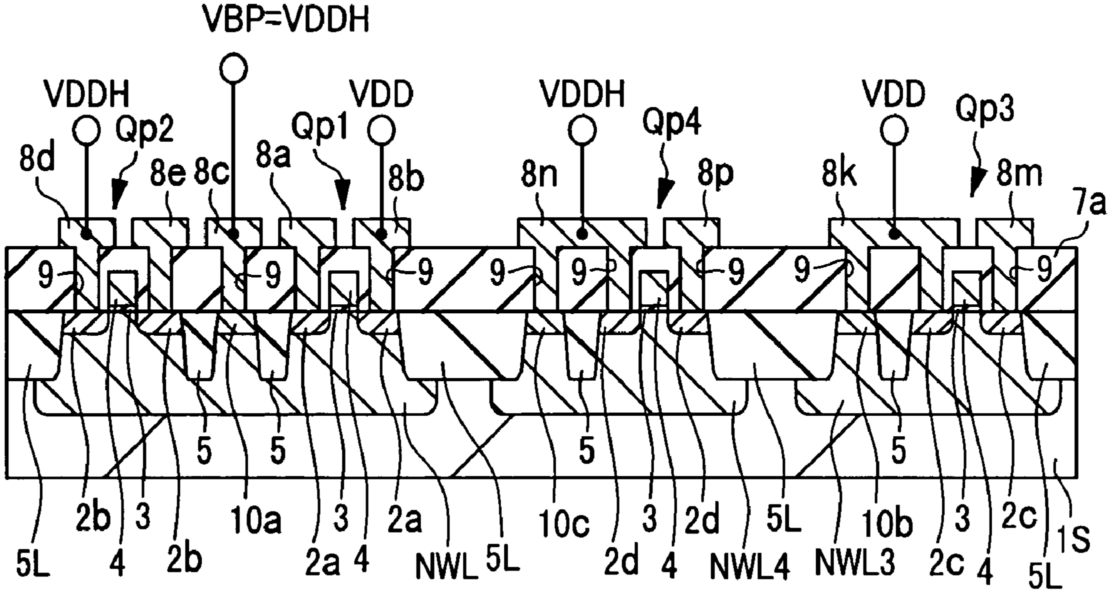
FIG. 18 is a sectional view showing the principal part of an example of a semiconductor device according to another embodiment of the present invention.

FIG. 18 is a sectional view showing the principal part of an example of the semiconductor device representing a basic structure of the fourth embodiment. For example, four pMISs Qp1 to Qp4 are formed on the main surface of the substrate 1S. The pMISs Qp1 and Qp3 are driven by the supply voltage (source voltage) VDD and the pMISs Qp2 and Qp4 are driven by the supply voltage (source voltage) VDDH. The n well NWL of the pMISs Qp1 and Qp2 driven by the different supply voltages VDD and VDDH is a common well as described in the first to third embodiments, and the common supply voltage VDDH is applied as the well bias voltage VBP to the n well NWL.

Figure 19:
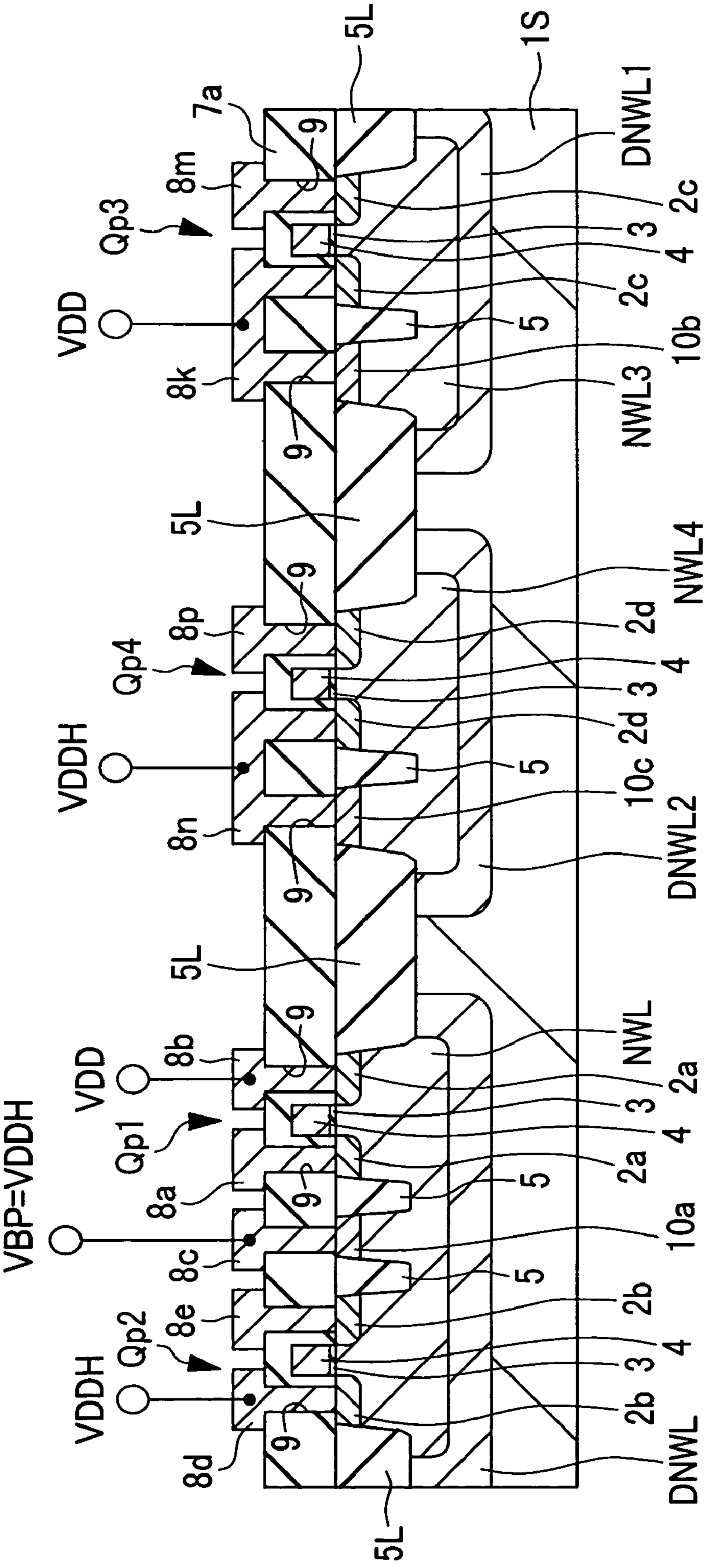
FIG. 19 is a sectional view showing the principal part of an example of the structure in which a buried n well is provided in the structure shown in FIG. 18.

Meanwhile, the pMIS (third and eighth field-effect transistors) Qp3 includes the $p^+$ semiconductor regions 2*c* for source and drain, the gate insulator 3, and the gate electrode 4. An electrode 8*k* is electrically connected to one of the $p^+$ semiconductor regions 2*c* and the well power-supply $p^+$ semiconductor region 10*b* through the contact holes 9 and 9. The supply voltage VDD is applied to the electrode 8*k*. More specifically, a pMIS Qp3 is driven by the supply voltage (source voltage) VDD, and the supply voltage VDD is applied as well bias voltage to the n well NWL3 of the pMIS Qp3. The supply voltage VSS is applied as reference voltage to an electrode 8*m*. The electrodes 8*k* and 8*m* each have the same structure as that of the electrode 8*a* and the like. Also, a pMIS (fourth and ninth field-effect transistors) Qp4 includes the $p^+$ semiconductor regions 2*d* for source and drain, the gate insulator 3, and the gate electrode 4. An electrode 8*n* is electrically connected to one of the $p^+$ semiconductor regions 2*d* and the well power-supply $n^+$ semiconductor region 10*c* through the contact holes 9 and 9. The supply voltage VDDH (>supply voltage VDD) is applied to the electrode 8*n*. More specifically, the pMIS Qp4 is driven by the supply voltage (source voltage) VDDH, and the supply voltage VDDH is applied as well bias voltage to the n well NWL4 of the pMIS Qp4. The supply voltage VSS is applied as reference voltage to an electrode 8*p*. The electrodes 8*n* and 8*p* each have the same structure as that of the electrode 8*a* and the like. Wide isolations 5L are arranged as usual between the n wells NWL3 and NWL4 of the pMISs Qp3 and Qp4 driven by the different supply voltages VDD and VDDH from the viewpoint of the inhibition and the prevention of the latch-up phenomenon, and each of the n wells NWL3 and NWL4 is arranged so as to separate from the other n wells. Moreover, FIG. 19 shows a structure in which the buried n wells DNWL, DNWL1, DNWL2 are provided in the structure shown in FIG. 18. Similarly to the case in FIG. 18, the n well NWL of the pMISs Qp1 and Qp2 is formed so as to share the well supply voltage, and the n wells NWL3 and NWL4 of the pMISs Qp3 and Qp4 are formed so as to isolate the well supply voltage. The way to apply voltage to each of the electrodes 8*a* to 8*e*, 8*k*, 8*m*, 8*n*, and 8*p* is also identical to that in FIG. 18.

Figure 20:
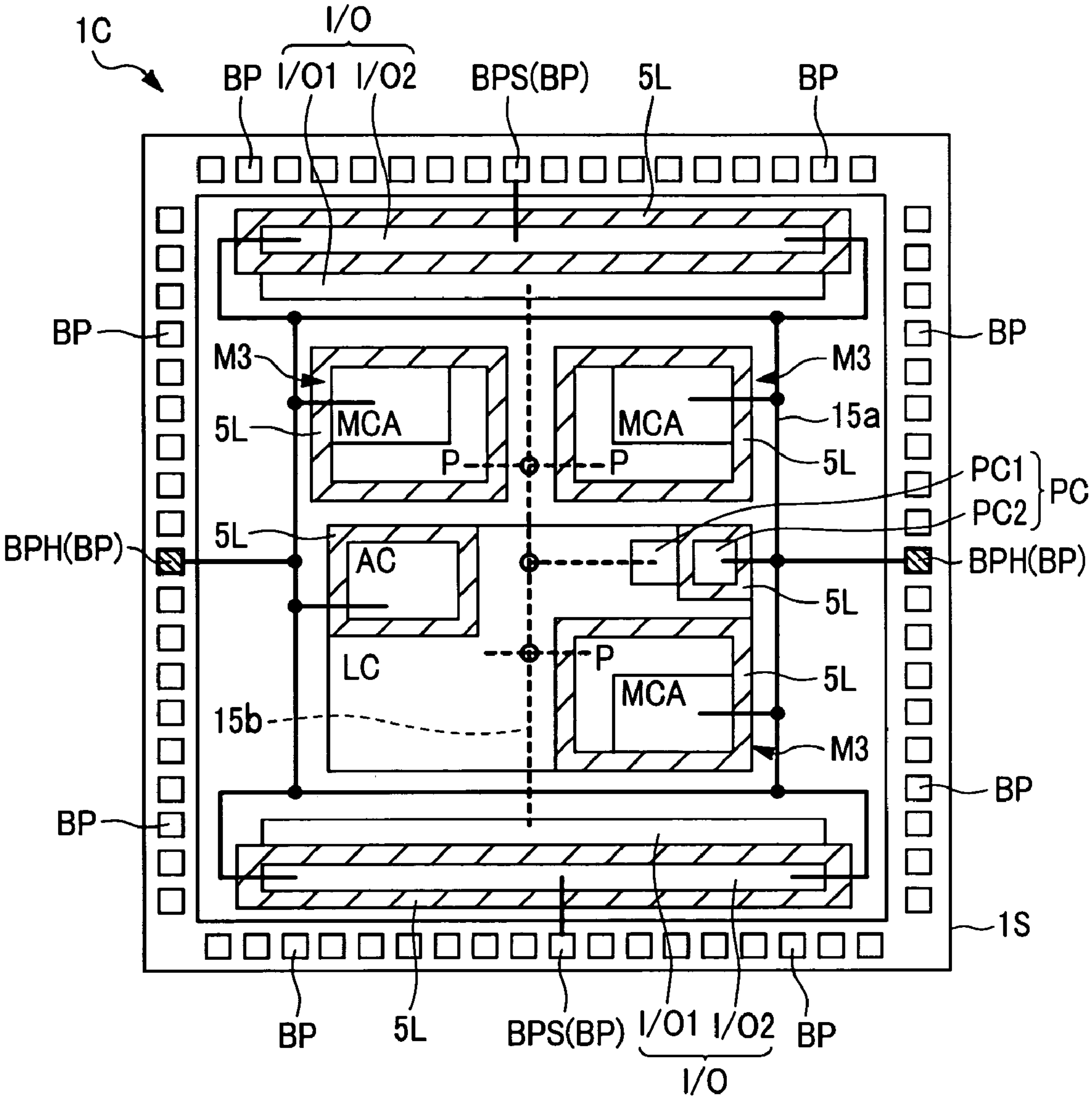
FIG. 20 is a plan view of a semiconductor chip of a semiconductor device according to another embodiment of the present invention.
Figure 21:
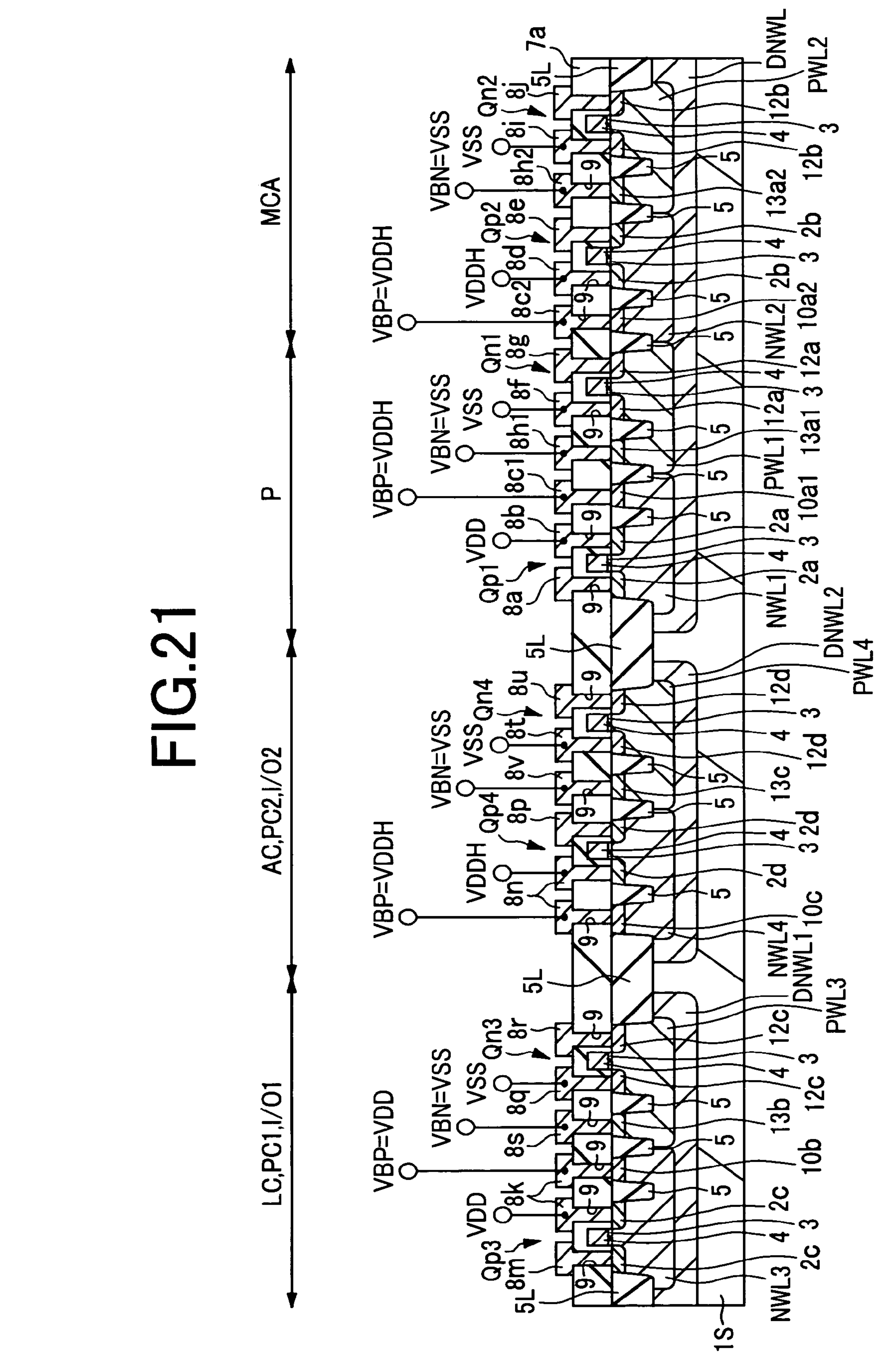
FIG. 21 is a sectional view showing the principal part of the semiconductor device in FIG. 20.

Next, the case where the structure according to the fourth embodiment is applied to a semiconductor device having, for example, a SOC (System On a Chip) structure will be described. FIG. 20 is a plan view of a semiconductor chip 1C of the semiconductor device, and FIG. 21 is a sectional view of the principal part of the semiconductor device in FIG. 20.

On a main surface of the semiconductor chip 1C, there are for example formed three SRAM macros M3, a logical circuit LC, an analog circuit AC, a power supply circuit PC, an input/output circuit I/O, a plurality of bonding pads (referred to as "pad" hereinafter) BP, and wirings 15*a* and 15*b*. Though not particularly limited, the supply voltage VSS is the earth voltage of, for example, 0 V, the supply voltage VDD is, for example, approximately 0.8 V, and the supply voltage VDDH is, for example, approximately 1.2 V.

Similarly to those described above, the SRAM macro M3 has the memory cell array MCA and the peripheral circuit P. The pMIS Qp2 of the memory cell array MCA is driven by the supply voltage VDDH used as source voltage, and the pMIS Qp1 of the peripheral circuit P is driven by the supply voltage VDD used as source voltage. However, the same supply voltage VDDH is supplied as well bias voltage to the n wells NWL1 and NWL2 of the pMISs Qp1 and Qp2 (shared well supply voltage method). By so doing, the width of the isolation 5 between the pMISs Qp1 and Qp2 driven by the different supply voltages can be reduced, whereby it becomes possible to reduce the area occupied by the SRAM macro M3. Therefore, the planar area of the semiconductor chip 1C can be reduced. The threshold voltages of the pMISs Qp1 and Qp2 of the SRAM macro M3 can be adjusted in the same manner as that in the first embodiment.

In the other logical circuit LC, the analog circuit AC, the power supply circuit PC, and the input/output circuit I/O, etc., the wells of the MISs driven by the different supply voltages (source voltages) are isolated by the wide isolation 5L, and the different well bias voltages are respectively supplied thereto (isolated well supply voltage method).

The source voltage and the well bias voltage of the pMIS Qp3 of the logical circuit LC are, for example, the supply voltage VDD. The source voltage and the well bias voltage of the pMIS Qp4 of the analog circuit AC are, for example, the supply voltage VDDH. Since the source voltages of the pMISs Qp3 and Qp4 are different in the logical circuit LC and the analog circuit AC, for example, the n well NWL4 of the analog circuit AC and the n well NWL3 of the logical circuit LC are isolated by surrounding the analog circuit AC with the wide isolation 5L.

The above-mentioned power supply circuit PC represents, for example, a voltage down converter circuit. The source voltage and the well bias voltage of the pMIS Qp3 in a region PC1 of the power supply circuit PC are the supply voltage VDD, and the source voltage and the well bias voltage of the pMIS Qp4 in a region PC2 thereof are the supply voltage VDDH higher than the supply voltage VDD. Although the regions PC1 and PC2 are device regions forming the same power supply circuit PC, the source voltages of the pMISs Qp3 and Qp4 are different from each other. Therefore, the n wells NWL3 and NWL4 of the regions PC1 and PC2 are isolated by surrounding the region PC2 with the wide isolation 5L. Since the source voltage and the well bias voltage of the pMIS of the region PC1 are equal to those of the pMIS of the logical circuit LC, the narrow isolation 5 is provided therebetween without forming the wide isolation 5L. In this case, the voltage down converter circuit is shown as an example of the power supply circuit PC. However, the same is true in the case of the voltage up converter circuit.

An input circuit, an output circuit, and an I/O bidirectional circuit are available as the above-mentioned input/output circuit I/O. The source voltage and the well bias voltage of the pMIS Qp3 in the region I/O1 of the input/output circuit I/O are the supply voltage VDD, and the source voltage and the well bias voltage of the pMIS Qp4 in the region I/O2 are the supply voltage VDDH higher than the supply voltage VDD. Although the regions I/O1 and I/O2 are the device regions for forming the same input/output circuit I/O, the source voltages of the pMISs Qp3 and Qp4 are different from each other. Therefore, the n wells NWL3 and NWL4 of the regions I/O1 and I/O2 are respectively isolated by surrounding the region I/O2 with the wide isolation 5L. Since the source voltage and the well bias voltage of the pMIS Qp3 in the region I/O1 are equal to those of each pMIS Qp3 of the region PC1 of the power supply circuit PC and the logical circuit LC, the narrow isolation 5 is provided therebetween without forming the wide isolation 5L.

The pad BP is a connection portion through which a circuit in the semiconductor chip 1C and an external device are connected. A bonding wire or bump is joined to each of the pads BP. The supply voltage VDDH is supplied to pads BPH of the pads BP. The supply voltage VDDH supplied to the pads BPH is supplied to each of the above-mentioned circuits through wirings 15*a* (solid line). The supply voltage VDDH supplied through the wirings 15*a* to the power supply circuit PC is stepped down to the supply voltage VDD in the power supply circuit PC. Then, the supply voltage VDD generated in the power supply circuit PC is supplied to each of the above-mentioned circuits through wirings 15*b* (dotted line). The pad BPS represents a pad for signal.

The nMIS Qn3 in each of the logical circuit LC, the region PC1 of the power supply circuit PC, and the region I/O1 of the input/output circuit I/O includes $n^+$ semiconductor region 12*c* for source and drain, the gate insulator 3, and the gate electrode 4. Also, the nMIS Qn4 in each of the analog circuit AC, the region PC2 of the power supply circuit PC, and the region I/O2 of the input/output circuit I/O includes $n^+$ semiconductor regions 12*d* for source and drain, the gate insulator 3, and the gate electrode 4. The source voltages and the well bias voltages of the nMISs Qn3 and Qn4 are the supply voltage VSS. More specifically, the supply voltage VSS is supplied to one of the semiconductor regions 12*c* of the nMIS Qn3 through an electrode 8*q*. Also, the supply voltage VSS is supplied to the p well PWL3 through an electrode 8*s* and a $p^+$ semiconductor region 13*b*. Meanwhile, the supply voltage VSS is supplied to one of the semiconductor regions 12*d* of the nMIS Qn4 through an electrode 8*t*. Also, the supply voltage VSS is supplied to the p well PWL4 through an electrode 8*v* and a $p^+$ semiconductor region 13*c*. In this fourth embodiment, the gate insulators 3 of the pMISs Qp1 to Qp 4 and the nMISs Qn1 to Qn4 on the main surface of the p substrate 1S are formed in the same process by a thermal oxidation method etc., and the gate insulators 3 of the pMISs Qp1 to Qp4 and the nMISs Qn1 to Qn4 each have the same thickness. Note that each structure of electrodes 8*r* to 8*v* is the same as that of the electrode 8*a*.

In the foregoing, the invention made by the present inventors has been concretely described based on the embodiments. However, needless to say, the present invention is not limited to the above-mentioned embodiments and can be variously modified and altered without departing from the gist thereof.

For example, the cases of using the p substrate have been described in the first to fourth embodiments. However, the present invention is not limited to this and may use an n substrate. In this case, the way to apply the voltage to each of the wells is the same as that described with reference to FIGS. 8 to 10. Moreover, it is also possible to provide deep buried p wells in the n substrate and then form each of the wells in the region of the buried well. In this case, the way to apply the voltage to each of the wells is the same as that described with reference to FIGS. 5 to 7.

In the foregoing description, the case where the invention made by the present inventors is applied to a semiconductor device having an SRAM, the semiconductor device belonging to the technical field in the background of the invention, has been described. However, the present invention is not limited to this, and can be for example applied to: a semiconductor device having a memory circuit such as a DRAM (Dynamic Random Access Memory) or a flash memory (EEPROM: Electric Erasable Programmable Read Only Memory); a semiconductor device having a logical circuit such as a microprocessor; or a merged semiconductor device in which the memory circuit and logical circuit are provided on the same semiconductor substrate.

Effects obtained by the typical ones of the inventions disclosed in this application will be briefly described as follows.

More specifically, a field-effect transistor driven by a first supply voltage and a field-effect transistor driven by a second supply voltage larger in absolute value than the first supply voltage are provided on the same first well of the same semiconductor substrate, and the second supply voltage is supplied to the first well. Therefore, an area of the isolation between the field-effect transistors driven by the different supply voltages can be greatly reduced, whereby it is possible to reduce the chip size of the semiconductor device.

What is claimed is:

1. A semiconductor device comprising:

a semiconductor substrate of a first conductivity type;

first, second, and third wells being each of a second conductivity type opposite to said first conductivity type and provided in said semiconductor substrate;

a first field-effect transistor being of a first channel conductivity type and driven by a first supply voltage, and a second field-effect transistor driven by a second supply voltage larger in absolute value than said first supply voltage, the first and second transistors being arranged in said first well;

a third field-effect transistor being of said first channel conductivity type and driven by said first supply voltage, the third transistor being arranged in said second well;

a fourth field-effect transistor being of a first channel conductivity type and driven by said second supply voltage, the fourth transistor being arranged in said third well;

a first isolation layer provided between said first and second field-effect transistors; and a second isolation layer provided between said first and second wells and between said second and third wells, wherein said second supply voltage is supplied to said first well, said first supply voltage is supplied to said second well, said second supply voltage is supplied to said third well, and said second isolation layer is wider than said first isolation layer.

2. The semiconductor device according to claim 1, wherein a threshold voltage of said first field-effect transistor is set lower than that of said second field-effect transistor.

3. The semiconductor device according to claim 1, wherein a gate insulator of said first field-effect transistor and that of said second field-effect transistor are equal to each other in thickness.

4. The semiconductor device according to claim 1, wherein said second field-effect transistor is a field-effect transistor constituting a memory cell of an SRAM, and said first field-effect transistor is a field-effect transistor constituting a peripheral circuit of said SRAM.

5. The semiconductor device according to claim 4, wherein said first, second, and third wells are provided so that they are respectively enclosed within first, second, and third buried wells, each of which is of said first conductivity type.

6. A semiconductor device comprising:

a semiconductor substrate of a first conductivity type;

first, second, and third buried wells being each of a second conductivity type opposite to said first conductivity type and provided in said semiconductor substrate;

first, second, and third wells being each of a second conductivity type and provided so that they are respectively enclosed within said first, second, and third buried wells;

a first field-effect transistor being of said first channel conductivity type and driven by a first supply voltage, and a second field-effect transistor being of said first channel conductivity type and driven by a second supply voltage larger in absolute value than said first supply voltage, the first and second transistors being provided in said first well;

a third field-effect transistor being of said first channel conductivity type and driven by said first supply voltage, the third transistor being arranged in said second well;

a fourth field-effect transistor of said first channel conductivity type and driven by said second supply voltage, the fourth transistor being arranged in said third well;

a first isolation layer provided between said first and second field-effect transistors; and a second isolation layer provided between said first and second wells and between said second and third wells, wherein said second supply voltage is supplied to said first well, said first supply voltage is supplied to said second well, said second supply voltage is supplied to said third well, and said second isolation layer is wider than said first isolation layer.

7. The semiconductor device according to claim 6, wherein a threshold voltage of said first field-effect transistor is set lower than that of said second field-effect transistor.

8. The semiconductor device according to claim 6, wherein a gate insulator of said first field-effect transistor and that of said second field-effect transistor are equal to each other in thickness.

9. The semiconductor device according to claim 6, wherein said second field-effect transistor is a field-effect transistor constituting a memory cell of an SRAM, and said first field-effect transistor is a field-effect transistor constituting a peripheral circuit of said SRAM.

10. A semiconductor device comprising:

a semiconductor substrate of a first conductivity type;

a first buried well, being of a second conductivity type opposite to said first conductivity type and provided in said semiconductor substrate;

a first well being of said second conductivity type and provided so that the first well is enclosed within said first buried well;

a first field-effect transistor being of said first channel conductivity type and driven by a first supply voltage; and a second field-effect transistor being of said first channel conductivity type and driven by a second supply voltage larger in absolute value than said first supply voltage, wherein the first and second field-effect transistors are arranged in said first well, and wherein said second supply voltage is supplied to said first well.

11. The semiconductor device according to claim 10, further comprising:

a second well of said first conductivity type is provided so that the second well is enclosed within said first buried well; and a third field-effect transistor of said second channel conductivity type opposite to said first channel conductivity type is arranged in said second well.

12. A semiconductor device comprising:

a semiconductor substrate of a first conductivity type;

a first buried well being of a second conductivity type opposite to said first conductivity type and provided in said semiconductor substrate;

first and second wells being each of said second conductivity type and provided so that they are enclosed within said first buried well;

third and fourth wells being each of said first conductivity type and provided so that they ate enclosed within said first buried well;

a first field-effect transistor being of said first channel conductivity type and driven by a first supply voltage, the first transistor being arranged in said first well;

a second field-effect transistor being of said first channel conductivity type and driven by a second supply voltage larger in absolute value than said first supply voltage, the second transistor being arranged in said second well;

a third field-effect transistor being of said second channel conductivity type opposite to said first channel conductivity type, the third transistor being arranged in said third well; and a fourth field-effect transistor of said second channel conductivity type, the fourth transistor being arranged in said fourth well, wherein said second supply voltage is supplied to both said first and second wells.

13. The semiconductor device according to claim 12, further comprising:

second and third buried wells, each of said second conductivity type, provided in said semiconductor substrate;

a fifth well of said second conductivity type provided so that the fifth well is enclosed within said second buried well;

a fifth field-effect transistor of said first channel conductivity type, driven by said first supply voltage and arranged in said fifth well;

a sixth well of said second conductivity type provided so that the sixth well is enclosed within said third buried well;

a sixth field-effect transistor of said first channel conductivity type, driven by said second supply voltage and arranged in said sixth well;

a first isolation layer provided between said first and second field-effect transistors; and a second isolation layer provided between said first and second wells and between said second and third wells, wherein said second isolation layer is wider than said first isolation layer, and wherein said first supply voltage is supplied to said fifth well, and said second supply voltage is supplied to said sixth well.

14. A semiconductor device, comprising:

a semiconductor substrate of a first conductivity type;

a first buried well being of a second conductivity type opposite to the first conductivity type and provided in said semiconductor substrate;

first and second wells being each of said second conductivity type and provided so that they are enclosed within said first buried well;

a third well being of said first conductivity type and provided between said first and second wells so that the third well is enclosed within said first buried well;

a first field-effect transistor being of said first channel conductivity type and driven by a first supply voltages the first transistor being arranged in said first well;

a second field-effect transistor being of said first channel conductivity type and driven by a second supply voltage larger in absolute value than said first supply voltage, the second transistor being arranged in said second well; and a third field-effect transistor of said second channel conductivity type opposite to said first channel conductivity type, the third transistor being arranged in said third well, wherein said second supply voltage is supplied to both of said first and second wells.

15. The semiconductor device according to claim 14, further comprising:

second and third buried wells being each of a second conductivity type are provided in said semiconductor substrate;

a fourth well of said second conductivity type provided so that the fourth well is enclosed within said second buried well;

a fourth field-effect transistor of said first channel conductivity type, driven by said first supply voltage and arranged in said fourth well, a fifth well is provided so that it is enclosed within said third buried well;

a fifth field-effect transistor of said first channel conductivity type, driven by said second supply voltage and arranged in said fifth well;

a first isolation layer provided between said first and second field-effect transistors; and a second isolation layer provided between said first and second wells and between said second and third wells, wherein said second isolation layer is wider than said first isolation layer, and wherein said first supply voltage is supplied to said fourth well, and said second supply voltage is supplied to said fifth well.

* * * * *

UNITED STATES PATENT AND TRADEMARK OFFICE

CERTIFICATE OF CORRECTION

PATENT NO. : 7,009,246 B2
APPLICATION NO. : 10/772391
DATED : March 7, 2006
INVENTOR(S) : T. Kawata et al.

It is certified that error appears in the above-identified patent and that said Letters Patent is hereby corrected as shown below:

On the title page, Item [73]:

Please correct the error in the name of the Assignee from “Hitachy, Ltd.” to --Hitachi, Ltd.--.

Signed and Sealed this

Eighteenth Day of July, 2006

JON W. DUDAS
*Director of the United States Patent and Trademark Office*